United States Patent
Chang et al.

(10) Patent No.: US 12,014,796 B2
(45) Date of Patent: Jun. 18, 2024

(54) MEMORY DEVICE AND METHOD OF OPERATING THE SAME

(71) Applicant: Taiwan Semiconductor Manufacturing Company, Ltd., Hsinchu (TW)

(72) Inventors: Meng-Sheng Chang, Chubei (TW); Ku-Feng Lin, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 137 days.

(21) Appl. No.: 17/669,628

(22) Filed: Feb. 11, 2022

(65) Prior Publication Data

US 2023/0260557 A1 Aug. 17, 2023

(51) Int. Cl.
*G11C 7/06* (2006.01)
*G11C 7/10* (2006.01)
*G11C 8/08* (2006.01)

(52) U.S. Cl.
CPC ............... *G11C 7/1012* (2013.01); *G11C 7/06* (2013.01); *G11C 7/1063* (2013.01); *G11C 7/109* (2013.01); *G11C 7/1096* (2013.01); *G11C 8/08* (2013.01)

(58) Field of Classification Search
CPC ....................................................... G11C 7/06
USPC ................................................... 365/189.02
See application file for complete search history.

(56) References Cited

U.S. PATENT DOCUMENTS

| | | | |
|---|---|---|---|
| 7,259,979 B2 | 8/2007 | Sachan et al. | |
| 8,233,330 B2* | 7/2012 | Wu | G11C 7/1051 365/205 |
| 10,224,088 B1* | 3/2019 | Choy | G11C 11/1675 |
| 2004/0114428 A1* | 6/2004 | Morikawa | G11C 11/16 365/158 |
| 2007/0053233 A1* | 3/2007 | Naura | G11C 16/344 365/205 |
| 2009/0225586 A1* | 9/2009 | Ueda | G11C 29/12 365/158 |
| 2017/0206949 A1 | 7/2017 | Pickering | |
| 2021/0020237 A1* | 1/2021 | Carissimi | G11C 16/26 |
| 2022/0085073 A1* | 3/2022 | Onuki | G11C 11/4097 |

FOREIGN PATENT DOCUMENTS

| | | |
|---|---|---|
| TW | 202135055 A | 9/2021 |
| TW | I739836 B | 9/2021 |

OTHER PUBLICATIONS

Taiwan Office Action issued in connection with TW Appl. Ser. No. 111113721 dated Jul. 12, 2023.

* cited by examiner

*Primary Examiner* — Muna A Techane
(74) *Attorney, Agent, or Firm* — FOLEY & LARDNER LLP

(57) ABSTRACT

A memory device includes a plurality of memory cells including a first memory cell and a second memory cell, a first bit line connected to the first memory cell, a second bit line connected to the second memory cell, a first word line connected to the first and second memory cells, a first control transistor connected to the first bit line, a second control transistor connected to second bit line, a first mux transistor commonly connected to the first and second control transistors, and a sense amplifier connected to the first mux transistor.

20 Claims, 7 Drawing Sheets

MEMORY DEVICE AND METHOD OF OPERATING THE SAME

BACKGROUND

In general, memory devices may be volatile memory devices and non-volatile memory (NVM) devices. Volatile memory devices can store data while power is provided but may lose the stored data once the power is shut off. A one-time programmable (OTP) memory device is a type of NVM often used for read-only memory (ROM). When the OTP memory device is programmed, the device cannot be reprogrammed. An eFuse memory cell is a type of OTP memory device that includes a one-transistor, one-resistor (1T1R) configuration. As technology continues to advance and follow Moore's law, it is desirable to have devices that have small cell areas.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
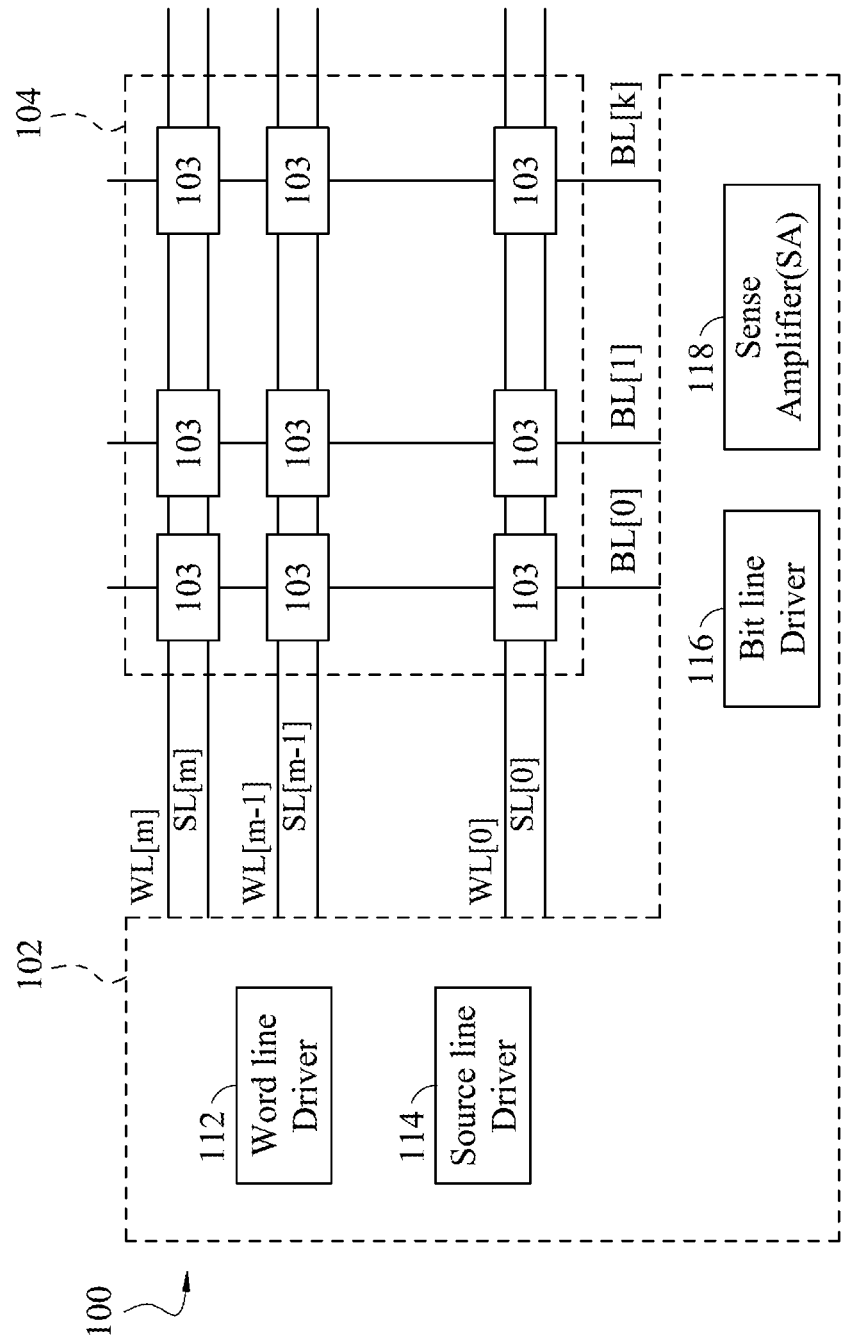
FIG. 1 illustrates a schematic block diagram of a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As integrated circuit (IC) technology advances, IC features (e.g., transistor gate length) continue to decrease, thereby allowing for more circuitry to be implemented in an IC. A memory device may include a matrix of memory cells arranged in rows and columns. A typical memory cell may include a selector transistor and a storage unit such as a resistor (e.g., fuse resistor) or a capacitor. Memory devices also use sense amplifiers to access and detect a stored logic state of the selected memory cell. However, as transistors become smaller, voltage stress issues may arise using current structures. Accordingly, it is becoming more common to use a stacked transistor structure to, for example, access the row (e.g., a word line transistor and a cascode gate transistor) as well as stacked transistors to access the column (e.g., bit line transistor and a cascode gate transistor), which may reduce a voltage stress on the transistors. However, using stacked transistors can increase the size of the widths of the transistors in order to provide the same driving capacity, which causes the overall area of the memory device to increase. Larger memory cells are also undesirable because parasitic resistances may increase which may cause additional power and compensation.

In this regard, some memory devices are formed with a common word line transistor (or word line selector) to activate a plurality of columns (via the word line), rather than using a word line transistor for each memory cell. A common point between two adjacent memory cells is used as a drain of the word line transistor. This can reduce the amount of area used by the word line transistors, and because the number of word line transistors are reduced by a factor of how many memory cells share the word line selector, an effective cell area may be reduced. However, while area is reduced, reliability of the memory device may degrade due to additional bit line leakage that flow through unselected memory cells. For example, when reading from a memory cell in row 2 and column 1 of a memory device, the word line for row 2 is activated (e.g., set to turn-on voltage such as VDD) while the word line for row 1 is deactivated (e.g., set to turn-off voltage such as 0V). In addition, a voltage of the sense amplifier enable for the selected column may be activated, thereby allowing current to flow through the bit line of both memory cells located in rows 1 and 2 and column 1. A leakage current path may form from the bit line to the memory cell on row 1 and column 1, which may affect reading from the selected memory cell on row 2 and column 1. An additional leakage current path may be formed from the memory cell row 1 and column 1 to the memory cell row 1 and column 2 due to a voltage difference in the cascode transistor between the source and drain. The additional BL leakage can cause read margin and read speed degradation, leading to worse performance. Accordingly, there is a desire to reduce the leakage current that may occur from unselected memory cells.

In the present disclosure, a novel sensing structure and scheme can be used to provide several advantages over the current technology. For example, instead of each bit line having its own bit line transistor, a common bit line transistor may be formed that connect a plurality of columns together. The common bit line transistor may be formed to connect to a plurality of cascode transistors which are then connected to the individual bit lines. At a common point that connects the bit line transistor to the plurality of cascode transistors, another transistor may be formed that can be connected to ground such that leakage current may flow to ground. Because the cascode transistors connected to the common bit line transistor are all turned on at the same time, and there is no voltage difference between the source and drain of the cascode transistor in a selected memory cell (a memory cell located on row 1 and column 2 in the above example), a leakage current may be advantageously reduced and/or canceled and the memory device may operate more reliably.

FIG. 1 illustrates a schematic block diagram of a memory device 100, in accordance with some embodiments. A memory device is a type of an IC device. In at least one embodiment, a memory device is an individual IC device. In some embodiments, a memory device is included as a part of a larger IC device which comprises circuitry other than the memory device for other functionalities.

The memory device 100 comprises at least one memory cell 103 and a controller (also referred to as "control circuit") 102 coupled to control an operation of the memory cell 103. In the example configuration in FIG. 1, the memory device 100 comprises a plurality of memory cells 103 arranged in a plurality of columns and rows in a memory array 104. The memory device 100 further comprises a plurality of word lines WL[0] to WL[m] extending along the rows, a plurality of source lines SL[0] to SL[m] extending along the rows, and a plurality of bit lines (also referred to as "data lines") BL[0] to BL[k] extending along the columns of the memory cells 103. Each of the memory cells 103 is coupled to the controller 102 by at least one of the word lines, at least one of the source lines, and at least one of the bit lines. Examples of word lines include, but are not limited to, read word lines for transmitting addresses of the memory cells 103 to be read from, write word lines for transmitting addresses of the memory cells 103 to be written to, or the like. In at least one embodiment, a set of word lines is configured to perform as both read word lines and write word lines. Examples of bit lines include read bit lines for transmitting data read from the memory cells 103 indicated by corresponding word lines, write bit lines for transmitting data to be written to the memory cells 103 indicated by corresponding word lines, or the like. In at least one embodiment, a set of bit lines is configured to perform as both read bit lines and write bit lines. In one or more embodiments, each memory cell 103 is coupled to a pair of bit lines referred to as a bit line and a bit line bar. The word lines are commonly referred to herein as WL, the source lines are commonly referred to herein as SL, and the bit lines are commonly referred to herein as BL. Various numbers of word lines and/or bit lines and/or source lines in the memory device 100 are within the scope of various embodiments. In at least one embodiment, the source lines SL are arranged in the columns, rather than in the rows as shown in FIG. 1. In at least one embodiment, the source lines SL are omitted.

In the example configuration in FIG. 1, the controller 102 comprises a word line driver 112, a source line driver 114, a bit line driver 116, and a sense amplifier (SA) 118 which are configured to perform at least one of a read operation or a write operation. In at least one embodiment, the controller 102 further includes one or more clock generators for providing clock signals for various components of the memory device 100, one or more input/output (I/O) circuits for data exchange with external devices, and/or one or more controllers for controlling various operations in the memory device 100. In at least one embodiment, the source line driver 114 is omitted.

The word line driver 112 is coupled to the memory array 104 via the word lines WL. The word line driver 112 is configured to decode a row address of the memory cell 103 selected to be accessed in a read operation or a write operation. The word line driver 112 is configured to supply a voltage to the selected word line WL corresponding to the decoded row address, and a different voltage to the other, unselected word lines WL.

The source line driver 114 is coupled to the memory array 104 via the source lines SL. The source line driver 114 is configured to supply a voltage to the selected source line SL corresponding to the selected memory cell 103, and a different voltage to the other, unselected source lines SL.

The bit line driver 116 (also referred as "write driver") is coupled to the memory array 104 via the bit lines BL. The bit line driver 116 is configured to decode a column address of the memory cell 103 selected to be accessed in a read operation or a write operation. The bit line driver 116 is configured to supply a voltage to the selected bit line BL corresponding to the decoded column address, and a different voltage to the other, unselected bit lines BL. In a write operation, the bit line driver 116 is configured to supply a write voltage (also referred to as "program voltage") to the selected bit line BL. In a read operation, the bit line driver 116 is configured to supply a read voltage to the selected bit line BL.

The SA 118 is coupled to the memory array 104 via the bit lines BL. In a read operation, the SA 118 is configured to sense data read from the accessed memory cell 103 and retrieved through the corresponding bit lines BL. The described memory device configuration is an example, and other memory device configurations are within the scopes of various embodiments. In at least one embodiment, the memory device 100 is NVM, and the memory cells 103 are OTP memory cells. Other types of memory are within the scopes of various embodiments. Example memory types of the memory device 100 include, but are not limited to, eFuse, anti-fuse, magnetoresistive random-access memory (MRAM), or the like.

The transistors in this disclosure are shown to have a certain type (n-type or p-type), but embodiments are not limited thereto. The transistors can be any suitable type of transistor including, but not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like.

In some embodiments, the controller 102 includes the word line driver 112, source line driver 114, bit line driver 116, and sense amplifier 118, as well as a plurality of other circuits such as one or more multiplexors, one or more pass gate transistors (or pass transistors), and/or one or more level shifters, where each of these other circuits can include p-type or n-type transistors. The multiplexors, the pass gate transistors, the sense amplifier 118, and the level shifters can be generally disposed on opposing sides of the word line driver 112, source line driver 114, and/or bit line driver 118. The controller 102 can be disposed on the substrate and connected to the memory array 104 through one or more bit lines BL, one or more source lines SL and/or one or more word lines WL that can be disposed in one or more metallization layers and/or one or more via structures.

Figure 2:
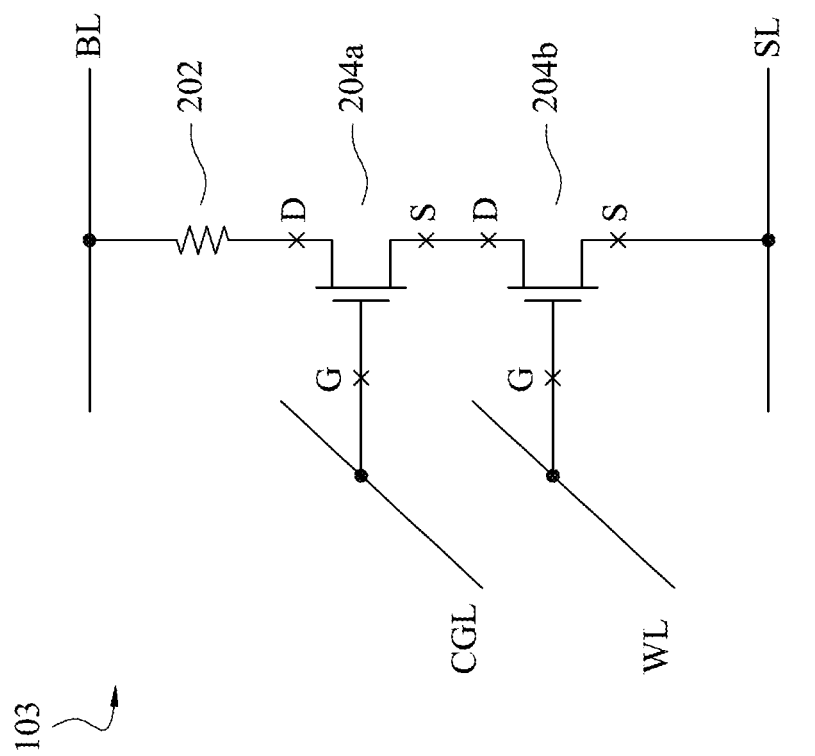
FIG. 2 illustrates an example configuration of a memory cell, in accordance with some embodiments.

FIG. 2 illustrates an example configuration of the memory cell 103 (FIG. 1), in accordance with some embodiments. In FIG. 2, the memory cell 103 includes an eFuse cell that is implemented as a 2T1R configuration, for example, a fuse resistor 202 serially connected to a stacked transistors including a cascode gate (CG) (or control gate) transistor 204a and an access transistor 204b. The CG transistor 204a may be provided to reduce a voltage stress on both the access transistor 204b. It, however, should be understood that any of various other fuse configurations that exhibit the fuse characteristic may be used by the memory cell 103 such as, for example, 1T1R, a 2-diodes-1-resistor (2D1R) configuration, a many-transistors-one-resistor (manyT1R) configuration, etc., while remaining within the scope of the present disclosure. Furthermore, the described technology is not limited to eFuse memory devices but can be applied to any memory that uses a transistor as a selector and a storage element such as a resistor or a capacitor.

In accordance with various embodiments of the present disclosure, the fuse resistor 202 is formed of one or more metal structures. For example, the fuse resistor 202 may be one of a number of interconnect structures in one of a number metallization layers that are disposed above or below the CG transistor 204a and/or the access transistor 204b. Specifically, both of the CG transistor 204a and the access transistor 204b are formed over a major surface of a semiconductor substrate, which is sometimes referred to as part of front-end-of-line (FEOL) processing. Over the FEOL processing, a number of metallization layers, each of which includes a number of interconnect (e.g., metal) structures, are typically formed, which are sometimes referred to as part of BEOL processing. During the BEOL processing, or between the FEOL and BEOL processing, there can be processing steps where local electrical connections between transistors and metal gate contacts are formed during the MEOL processing.

With the fuse resistor 202 (of the memory cell 103) embodied as a metal structure, the fuse resistor 202 may present an initial resistance value (or resistivity), for example, as fabricated. To program the memory cell 103, both of the CG transistor 204a and the access transistor 204b (if embodied as an n-type transistor) are turned on by applying a (e.g., voltage) signal, corresponding to a logic high state, through a CG line (CGL) or a WL to a gate terminal of the access transistor 204b. Concurrently or subsequently, a high enough (e.g., voltage) signal is applied on one of the terminals of the fuse resistor 202 through a BL. With the CG transistor 204a and the access transistor 204b turned on to provide a (e.g., program) path from the BL, through the fuse resistor 202, CG transistor 204a, and access transistor 204b, and to a SL, such a high voltage signal can burn out a portion of the corresponding metal structure (the fuse resistor 202), thereby transitioning the fuse resistor 202 from a first state (e.g., a short circuit) to a second state (e.g., an open circuit). Accordingly, the memory cell 103 can irreversibly transition from a first logic state (e.g., logic 1) to a second logic state (e.g., logic 0), which can be read out by applying a relatively low voltage signal on the BL and turning on the CG transistor 204a and the access transistor 204b to provide a (e.g., read) path.

Figure 3A:
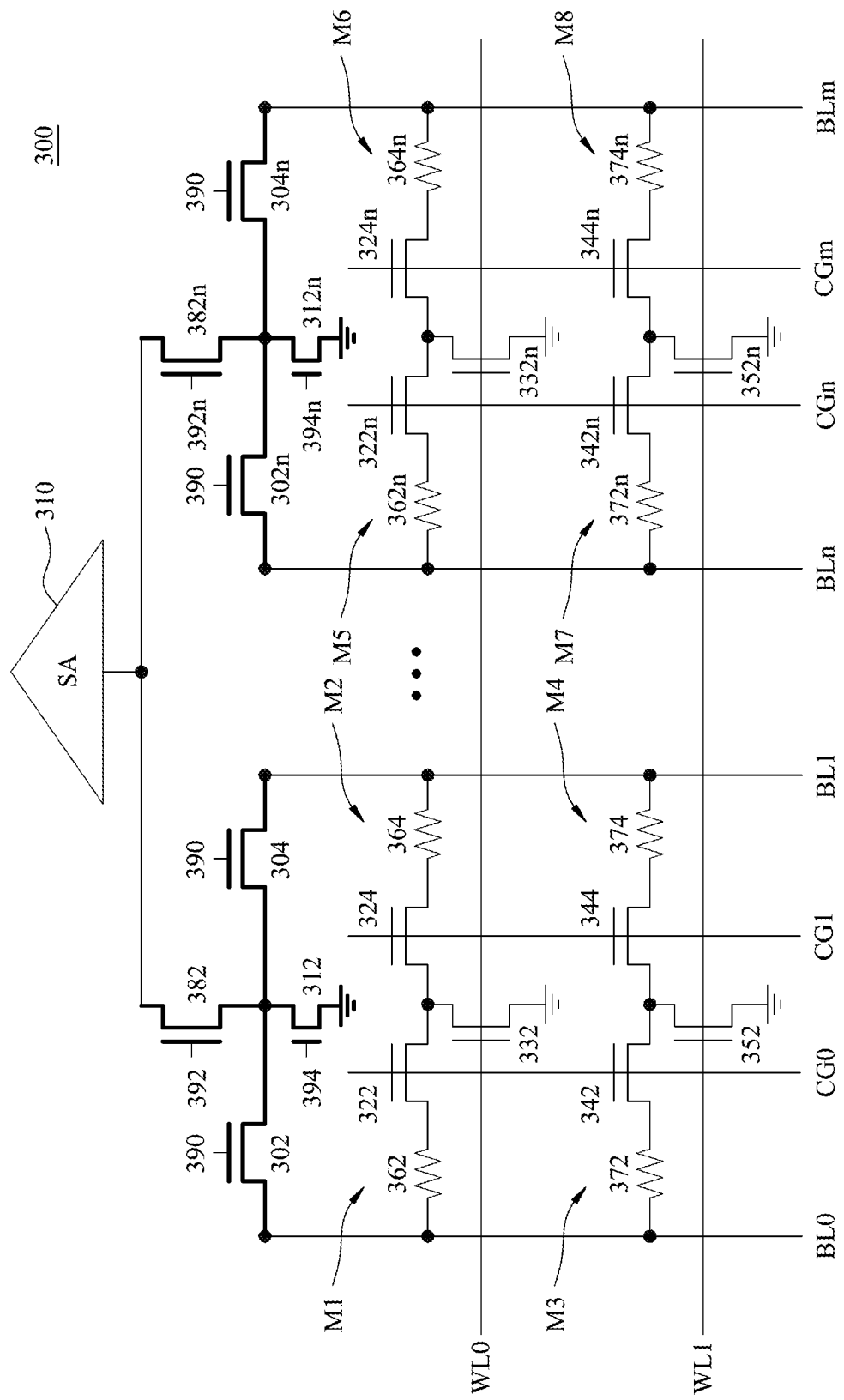
FIG. 3A illustrates a schematic of an example memory device, in accordance with some embodiments.

FIG. 3A illustrates a schematic of an example memory device 300, in accordance with some embodiments. The memory device 300 includes CG transistors 322, 324 . . . 322n, 324n, 342, 344 . . . 342n, 344n (e.g., CG transistor 204a of FIG. 2), shared gate (SG) transistors 302, 304 . . . 302n, 304n, a sense amplifier 310 (e.g., sense amplifier 118 of FIG. 1), control transistors 312 . . . 312n, and sense enable transistors (or mux transistor) 382 . . . 382n. The memory device 300 also may include a plurality of rows of memory cells. Furthermore, a plurality of signal lines carrying control signals are provided to the memory device 300, such as word line WL0, WL1, bit lines BL0, BL1 BLn, and BLm, and cascode gate (CG) lines CG0, CG1 . . . CGn, CGm. Although only a certain number of signal lines are shown, one of ordinary skill will recognize that there may be more or fewer signal lines. Further, although the memory device 300 is shown to have a certain circuit in FIG. 3A, embodiments are not limited thereto, and the described technology can be applied to any memory circuit that uses sense amplifiers. For example, as disclosed above, the memory cells can include eFuse, anti-fuse, metal-insulator-metal (MIM) memories, other one-time programmable (OTP) memories, dynamic random access memory (DRAM), and any other memory that uses a resistor or a capacitor as a storage unit.

Fuses 362, 364 . . . 362n, 364n, CG transistors 322, 324 . . . 322n, 324n, and WL transistors 332 . . . 332n (e.g., access transistor 204b of FIG. 2) may form a plurality of memory cells along bit line BL0 and bit line BL1. Fuse 362, CG transistor 322, and WL transistor 332 may form a first memory cell M1. Fuse 364, CG transistor 324, and WL transistor 332 may form a second memory cell M2. Fuse 372, CG transistor 342, and WL transistor 352 may form a third memory cell M3. Fuse 374, CG transistor 344, and WL transistor 352 may form a fourth memory cell M4. Fuses 372, 374 . . . 372n, 374n, CG transistors 342, 344 . . . 342n, 344n, and word line transistors 352 . . . 352n may form a plurality of memory cells along bit line BLn and bit line BLm. Fuse 362n, CG transistor 322n, and WL transistor 332n may form a fifth memory cell M5. Fuse 364n, CG transistor 324n, and WL transistor 332n may form a sixth memory cell M6. Fuse 372n, CG transistor 342n, and WL transistor 352n may form a seventh memory cell M7. Fuse 374n, CG transistor 344n, and WL transistor 352n may form an eighth memory cell M8. As discussed above, although this disclosure discusses memory cells with respect to a 2T1R configuration of a fuse (e.g., eFuse) memory cell, embodiments are not limited thereto, and the disclosed technology may be applied to any memory device including a sense amplifier to detect stored logic states in the memory cells.

The mux transistors 382 to 382n may be controlled by a mux control signal provided on mux control lines 392 to 392n. Although a not shown, a controller (e.g., controller 102 of FIG. 1) may include a decoder that may be used to provide the control signal to the mux control lines 392 to 392n. Each of the SG transistors 302-302n and 304-304n may be controlled by the same gate control signal provided on control line 390. Further, the controller may include a decoder that may provide the control signal to the control line 390.

Each of the first to eighth memory cells M1 to M8 may operate similar to the memory cell 103. In some embodiments, the selector for the particular cell may include the CG transistor (e.g., CG transistor 204a) stacked with the WL transistor (e.g., WL transistor 204b) to divide the voltage of an end of the fuse 362. This may help reduce a voltage stress on the CG and WL transistors for half-selected cases (e.g., either row or column is selected). For example, for the first memory cell, in order to program the fuse 362, a control signal (e.g., logic high) may be provided to the CG transistor 322 so that the user may either program (or write to) or read from the fuse 362 when the WL0 is turned on.

Figure 3B:
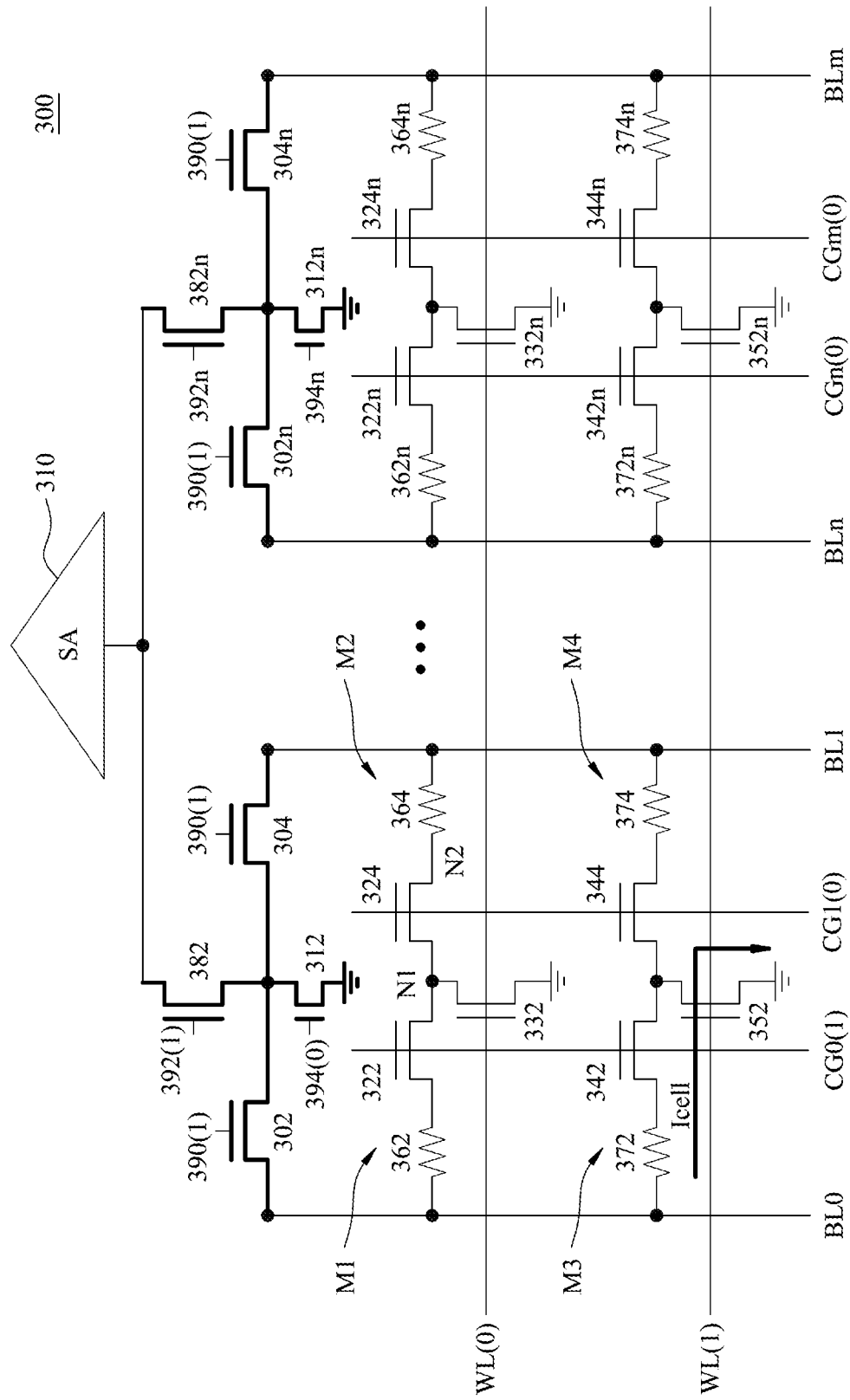
FIG. 3B illustrates the example memory device of FIG. 3A during a read operation, in accordance with some embodiments.

FIG. 3B illustrates the example memory device 300 of FIG. 3A during a read operation, in accordance with some embodiments. Although FIG. 3A is described in reference to reading from the memory cell including from fuse 372, embodiments are not limited thereto, the present technology may be applied when reading from any other memory cell within memory device 300. Further, reference numerals for certain signal lines in FIG. 3B are shown with the logical signal that is provided to those signal lines in parentheses for convenience.

When reading from memory cell M3, several signal lines may be activated (e.g., provided with a logic high signal). For example, after the bit line BL0 has been pre-charged to a predetermined level, the mux control line 392 may receive a logic high signal so that the memory cells connected to the two columns on BL0 and BL1 may be sensed. The mux control line 390 and the control line 392 may receive a logic high signal. The control line 394 may receive a logic low signal. The word line WL1 may receive a logic high signal. Accordingly, a current path Icell may be formed from the bit line BL0 to the ground. If the fuse 372 in memory cell M3 has not been burned off (e.g., short circuit), the charge from the bit line BL0 will flow to the ground through the fuse 372, the CG transistor 342, and the WL transistor 352. When the sense amplifier 310 senses the bit line BL0, the sense amplifier 310 will sense or detect that there is no charge on bit line BL0, and provide a logic low signal back to the controller, indicating that the memory cell M3 has a logic 0. If the memory cell M3 has a fuse 372 that has been burned (e.g., open circuit), the charge on the bit line BL0 will remain and the sense amplifier 310 can detect that the memory cell M3 has a logic 1.

During the read operation of the memory cell M3 having a logic 1, memory cell M1 may be half-selected because the control signal may be activated on CG line CG0 but the word line WL0 is not activated. However, there is no leakage current path that is formed in M2 because both the source and drain of the CG transistor 324 is high, and there is no voltage difference for a current to be formed. For example, a node N1 connecting the CG transistor 322, CG transistor 324, and the WL transistor 332 has a high voltage level, and a node N2 connecting the fuse 364 and the CG transistor 324 also has a high voltage level. And because the CG transistor 324 has a gate terminal that is set to logic 0 and a voltage difference between source and drain terminals is substantially 0V, there is no leakage current across the CG transistor 324. Therefore, a leakage current is reduced.

Accordingly, the BL leakage caused in the memory cell M2 can be reduced and/or eliminated. In some embodiments, both the read margin and the read speed can be improved. Furthermore, the memory cell area can be reduced by using a common transistor or a set of common transistors to select all of the columns connected to the same mux transistor, without suffering from read margin degradation.

Figure 4:
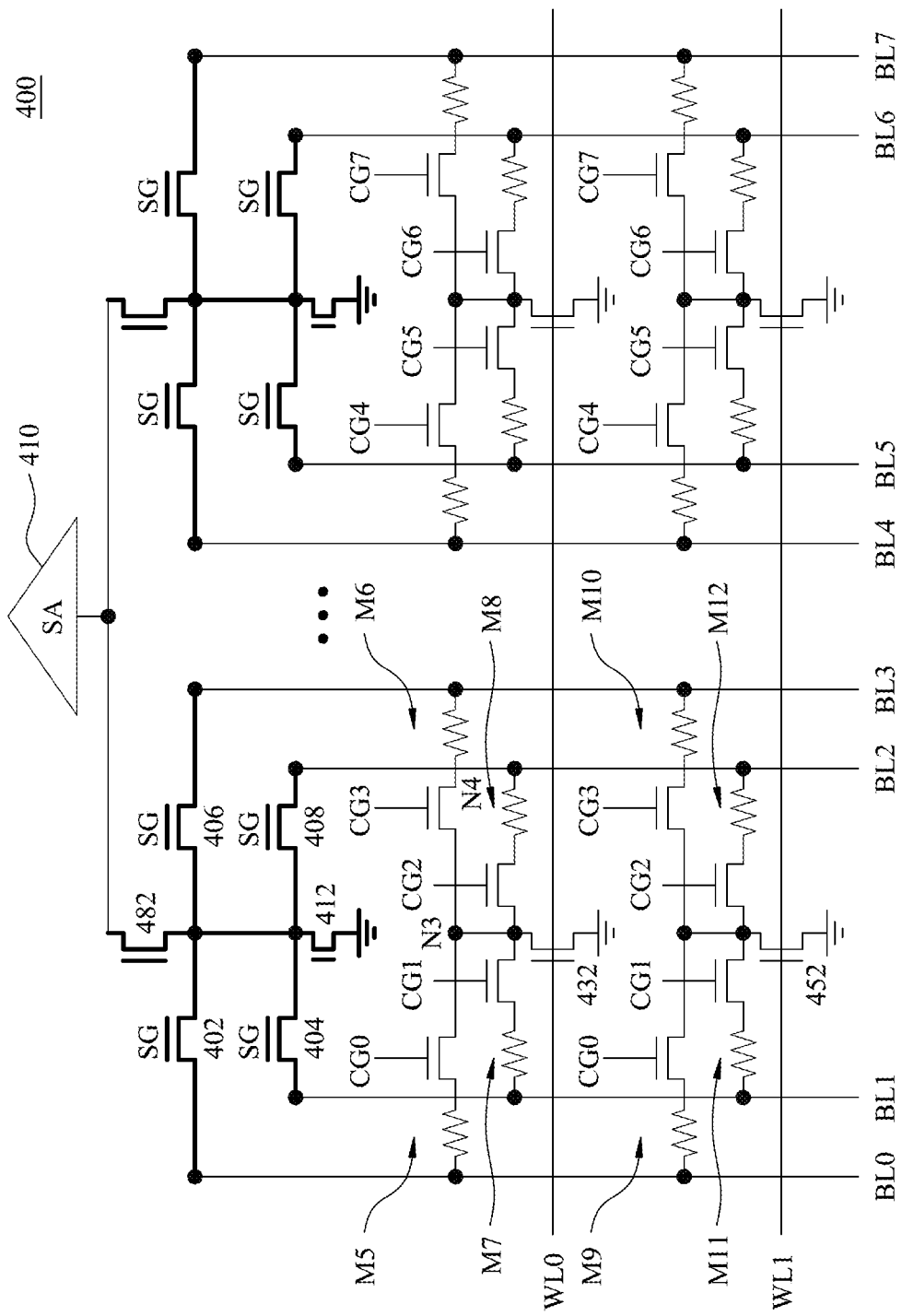
FIG. 4 illustrates an example memory device, in accordance with some embodiments.

FIG. 4 illustrates an example memory device 400, in accordance with some embodiments. The memory device 400 is similar to the memory device 300 of FIG. 3A except that there are four columns (e.g., corresponding to bit lines BL0, BL1, BL2, and BL3) connected to one word line transistor 432, SG transistor(s) 402, 404, 406, and 408, and control transistor 412. Similar descriptions are omitted for the sake of simplicity and clarity.

For example, memory device 400 has a plurality of memory cells M5, M6, M7, M8, M9, M10, M11, and M12, where memory cells M5-M8 are connected to one WL transistor 432 which is gated by word line WL0, and memory cells M9-M12 are connected to one WL transistor 452 which is gated by word line WL1. Furthermore, bit lines BL0-BL3 are respectively connected to SG transistors 402-408 which have gate terminals that are connected together such that the SG transistors 402-408 all have a shared gate terminal. The shared gate terminal can receive a control signal that can activate all of the SG transistors 402-408.

During a read operation of the memory cell M9, the word line WL1 is activated and word line WL0 is not activated. There may be a leakage current from the bit line BL3 to the memory cell M6 that may be reduced or avoided because a voltage difference between node N3 and node N4 is substantially 0V.

Although memory device 400 shows each WL transistor being connected to four memory cells (e.g., WL transistor 432 is connected to memory cells M5-M8, WL transistor 452 is connected to memory cells M9-M12), embodiments are not limited thereto, and there can be more configurations of the memory device 400. For example, in another configuration, each WL transistor may be connected to M number of memory cells per group, and N number of groups of M memory cells per group, totaling M×N number of memory cells per row, where each of M and N is a positive integer. For example, in a row with 32 memory cells configured to be sensed by a sense amplifier, there may be 8 groups of memory cells with 4 memory cells per group. Accordingly, a plurality of configurations of M and N may be contemplated.

Figure 5:
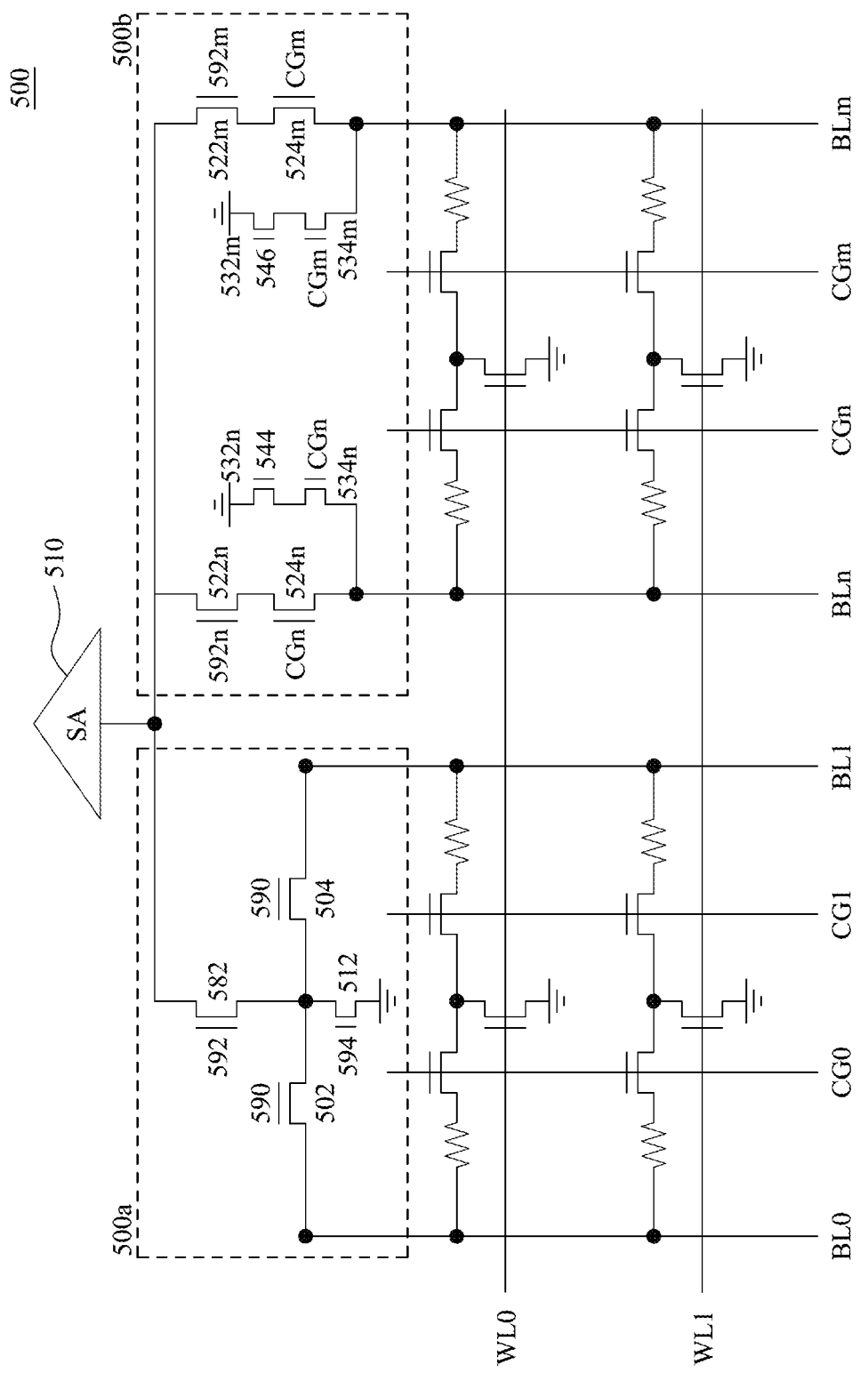
FIG. 5 illustrates an example memory device including a mixed sensing structures, in accordance with some embodiments.

FIG. 5 illustrates an example memory device 500 including a mixed sensing structures, in accordance with some embodiments. The example memory device 500 includes a first sensing structure 500a and a second sensing structure 500b. The first sensing structure 500a includes a sensing structure similar to the same sensing structure described with respect to FIGS. 3A-4. For example, the sensing structure 500a may include SG transistors 502 (e.g., SG transistor 302, 402), SG transistor 504 (e.g. SG transistor 504), control transistor 512 (e.g., control transistor 312), and mux transistor 582 (e.g., mux transistor 382). Furthermore, the SG transistors 502 and 504 may be gated by control line 590 (e.g., control line 390), control transistor 512 may be gated by control line 594 (e.g., control line 394), and the mux transistor 582 may be gated by the mux control line 592 (e.g., mux control line 392). Therefore, similar descriptions are omitted.

The second sensing structure 500b may include a typical sensing structure and structure where each bit line BLn and BLm is connected to two stacked transistors in series for column access to sense the memory cells connected to the bit lines BLn and BLm. For example, the bit line BLn can be connected to the first stacked transistor 522n and second stacked transistor 524n such that when both transistors are turned on via control lines 592n and CGn having active high signals, a voltage on the bit line BLn can be sensed by the sense amplifier 510. Another set of stacked transistors 532n and 534n may be provided to ground so that a leakage current can flow to ground when control signals 544 and CGn are active high. The bit line BLm can be connected to the third stacked transistor 522m and fourth stacked transistor 524m such that when both transistors are turned on via control lines 592m and CGm having active high signals, a voltage on the bit line BLm can be sensed by the sense amplifier 510. Another set of stacked transistors 532m and 534m may be provided to ground so that a leakage current can flow to ground when control signals 546 and CGm are active high.

Accordingly, a memory device 500 having mixed sensing structures may be provided depending on embodiments and design requirements. In some embodiments, the sensing structures 500a and 500b may be used alternatingly for each group of memory devices. In some other embodiments, the sensing structure 500a may be used in a first X number of columns, and the sensing structure 500b may be used in a Y number of columns following the X number of columns, where X and Y are positive integers. Further, any combination of sensing structures 500a and 500b may be used.

Figure 6:
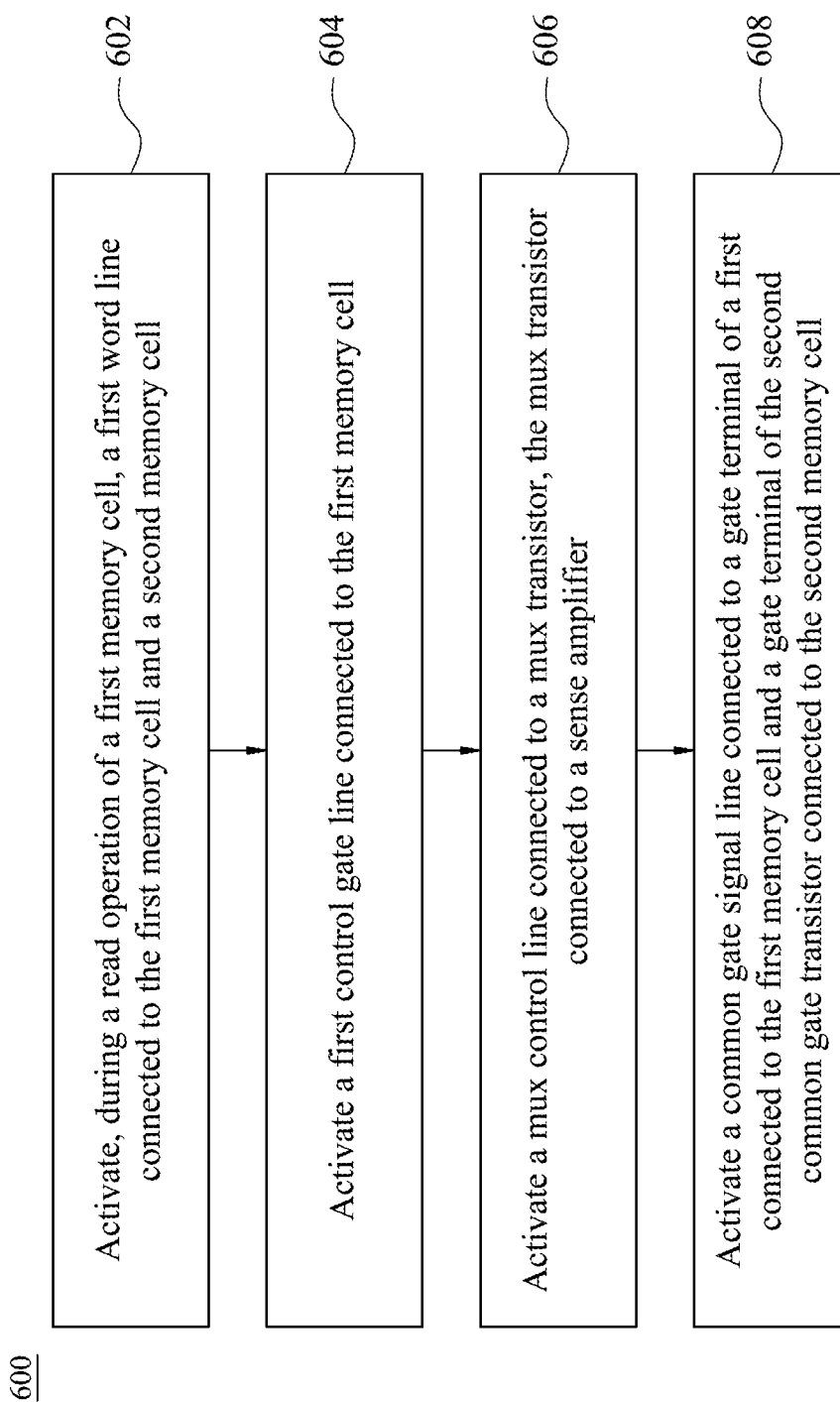
FIG. 6 illustrates a flowchart of an example method of operating a memory device, in accordance with some embodiments.

FIG. 6 illustrates a flowchart of an example method 600 of operating a memory device, in accordance with some embodiments. The method 600 may be used to read from a memory cell with a wide read margin. For example, at least some of the operations described in the method 600 operate the memory devices 100, 300, 400 or 500. It is noted that the method 600 is merely an example and is not intended to limit the present disclosure. Accordingly, it is understood that additional operations may be provided before, during, and after the method 600 of FIG. 6, and that some other operations may only be briefly described herein.

In brief overview, the method 600 starts with operation 602 of activating, during a read operation of a first memory cell, a first word line connected to the first memory cell and a second memory cell. The method 600 proceeds to operation 604 of activating a first control gate line connected to the first memory cell. The method 600 proceeds to operation 606 of activating a mux control line connected to a mux transistor, the mux transistor connected to a sense amplifier. The method 600 proceeds to operation 608 of activating a common gate signal line connected to a gate terminal of a first common gate transistor connected to the first memory cell and a gate terminal of the second common gate transistor connected to the second memory cell.

Referring to operation 602, during a read operation of a first memory cell (e.g., memory cell M3 of FIG. 3B), a first word line (e.g., word line WL1) that is connected to both the first memory cell and a second memory cell (e.g., memory cell M4) is activated by a controller (e.g., controller 102). A word line transistor (e.g., WL transistor 352) may be shared by the first and second memory cells.

Referring to operation 604, a first control gate line (e.g., cascode gate line CG0) may be activated. The first control gate line may extend in the same direction as the bit lines.

Referring to operation 606, a mux control line (e.g., mux control line 392) connected to a mux transistor (e.g., mux transistor 382) may be activated. The mux transistor may be connected to a sense amplifier (e.g., sense amplifier 310). The mux control line may control whether or not the sense amplifier may sense a current from the first memory cell during the read operation.

Referring to operation 608, a common gate signal line (e.g., control line 390) may be activated. The common gate signal may be connected to a gate terminal of a first common gate transistor (e.g., shared gate transistor 302) connected to the first memory cell and a gate terminal of the second common gate transistor connected to the second memory cell.

Accordingly, a leakage current from an unselected memory cell may be reduced and/or eliminated during a read operation of a selected memory cell. Further, a sensing structure connected to the memory cells may have a reduced area while still having good read margins, thereby optimizing the area without sacrificing reliability and performance.

The disclosed technology may be applied to various memory configurations with various sensing structures such that one word line may activate a plurality of memory cells on the same row.

In one aspect of the present disclosure, a memory device is disclosed. The memory device includes a plurality of memory cells including a first memory cell and a second memory cell, a first bit line connected to the first memory cell, a second bit line connected to the second memory cell, a first word line connected to the first and second memory cells, a first control transistor connected to the first bit line, a second control transistor connected to second bit line, a first mux transistor commonly connected to the first and second control transistors, and a sense amplifier connected to the first mux transistor.

In another aspect of the present disclosure, a method of operating a memory device is disclosed. The method includes activating, during a read operation of a first memory cell, a first word line connected to the first memory cell and a second memory cell, activating a first control gate line connected to the first memory cell, activating a mux control line connected to a mux transistor, the mux transistor connected to a sense amplifier, and activating a common gate signal line connected to a gate terminal of a first common gate transistor connected to the first memory cell and a gate terminal of the second common gate transistor connected to the second memory cell.

In yet another aspect of the present disclosure, a memory system is disclosed. The memory system includes a plurality of memory cells including a first memory cell and a second memory cell, a sense amplifier connected to the plurality of memory cells via a plurality of bit lines, and a controller connected to the plurality of memory cells. The controller is configured to activate, during a read operation of a first memory cell, a first word line connected to the first memory cell and a second memory cell, activate a first control gate line connected to the first memory cell; activate a mux control line connected to a mux transistor, the mux transistor connected to a sense amplifier, and activate a common gate signal line connected to a gate terminal of a first common gate transistor connected to the first memory cell and a gate terminal of the second common gate transistor connected to the second memory cell.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a plurality of memory cells including a first memory cell and a second memory cell, wherein the first and second memory cells share a first word line transistor;
   a first bit line connected to the first memory cell;
   a second bit line connected to the second memory cell;

a first word line connected to the first word line transistor shared by the first and second memory cells;
a first control transistor connected to the first bit line;
a second control transistor connected to second bit line;
a first mux transistor commonly connected to the first and second control transistors; and
a sense amplifier connected to the first mux transistor.

2. The memory device of claim 1, wherein the first and second control transistors each has a gate terminal connected to a common gate control line.

3. The memory device of claim 2, further comprising a controller, during a read operation of the first memory cell connected to the first word line, configured to:
activate the first word line;
activate the common gate control line; and
activate a mux control line connected to a gate terminal of the first mux transistor.

4. The memory device of claim 3, further comprising a third control transistor connected to the first and second control transistors and ground.

5. The memory device of claim 4, wherein the controller, during the read operation, is further configured to deactivate a control line connected to a gate terminal of the third control transistor.

6. The memory device of claim 5, further comprising a second word line connected to third and fourth memory cells of the plurality of memory cells.

7. The memory device of claim 6, wherein the controller is configured to, during the read operation, deactivate the second word line.

8. The memory device of claim 1, wherein the plurality of memory cells each comprise a storage unit including a resistor or a capacitor.

9. The memory device of claim 1, wherein the first word line is connected to an M number of the plurality of memory cells, and the sense amplifier is connected to an N number of mux transistors including the first mux transistor, where M and N are positive integers.

10. The memory device of claim 9, wherein a number of a plurality of control transistors, including the first and second control transistors, connected to a common gate line and a plurality of bit lines, including the first and second bit lines, connected to the mux transistor are equal to M.

11. A method of operating a memory device, comprising:
activating, during a read operation of a first memory cell, a first word line connected to a first word line transistor shared by the first memory cell and a second memory cell;
activating a first control gate line connected to the first memory cell;
activating a mux control line connected to a mux transistor, the mux transistor connected to a sense amplifier; and
activating a common gate signal line connected to a gate terminal of a first common gate transistor connected to the first memory cell and a gate terminal of a second common gate transistor connected to the second memory cell.

12. The method of claim 11, further comprising deactivating a second word line connected to a second word line transistor shared by a third memory cell and a fourth memory cell, wherein the second word line transistor having has (i) a drain terminal connected to a first control gate transistor of the third memory cell and a second control gate transistor of the fourth memory cell and Iii) a source terminal connected to the ground.

13. The method of claim 11, further comprising deactivating a second control gate line connected to the second memory cell.

14. The method of claim 11, wherein the memory cell includes a storage unit including a resistor or a capacitor.

15. The method of claim 11, wherein the first and second common gate transistors, the mux transistor, and a control transistor are connected to one another at a node.

16. A memory system, comprising:
a plurality of memory cells including a first memory cell and a second memory cell, wherein the first and second memory cells share a first word line transistor;
a sense amplifier connected to the plurality of memory cells via a plurality of bit lines; and
a controller connected to the plurality of memory cells, wherein the controller is configured to:
activate, during a read operation of a first memory cell, a first word line connected to the first word line transistor shared by the first memory cell and a second memory cell;
activate a first control gate line connected to the first memory cell;
activate a mux control line connected to a mux transistor, the mux transistor connected to a sense amplifier; and
activate a common gate signal line connected to a gate terminal of a first common gate transistor connected to the first memory cell and a gate terminal of a second common gate transistor connected to the second memory cell.

17. The memory system of claim 16, wherein the controller is further configured to deactivate a second word line connected to a second word line transistor shared by a third memory cell and a fourth memory cell, wherein the second word line transistor has (i) a drain terminal connected to the first control gate transistor of the third memory cell and a second control gate transistor of the fourth memory cell and cii) a source terminal connected to the ground.

18. The memory system of claim 16, wherein the controller is further configured to deactivate a second control gate line connected to the second memory cell.

19. The memory system of claim 16, wherein the plurality of memory cells each include a storage unit including a resistor or a capacitor.

20. The memory system of claim 16, wherein the first and second common gate transistors, the mux transistor, and a control transistor are connected to one another at a node.

* * * * *

UNITED STATES PATENT AND TRADEMARK OFFICE
CERTIFICATE OF CORRECTION

PATENT NO. : 12,014,796 B2
APPLICATION NO. : 17/669628
DATED : June 18, 2024
INVENTOR(S) : Meng-Sheng Chang et al.

It is certified that error appears in the above-identified patent and that said Letters Patent is hereby corrected as shown below:

In the Claims

Claim 12, Column 12, Line 4: delete --having--.

Claim 12, Column 12, Line 7: delete --lii)--, and replace it with "(ii)".

Claim 17, Column 12, Line 48: delete --cii)--, and replace it with "(ii)".

Signed and Sealed this
Sixth Day of August, 2024

Katherine Kelly Vidal
*Director of the United States Patent and Trademark Office*